United States Patent [19]

Wassermann et al.

[11] Patent Number: 4,562,407
[45] Date of Patent: Dec. 31, 1985

[54] AUTOMATIC REGULATION OF THE OUTPUT POWER OF AN AMPLIFIER

[75] Inventors: Manfred Wassermann, Backnang; Wolfgang Liebisch, Sulzbach, both of Fed. Rep. of Germany

[73] Assignee: ANT Nachrichtentechnik GmbH, Backnang, Fed. Rep. of Germany

[21] Appl. No.: 616,161

[22] Filed: Jun. 1, 1984

[30] Foreign Application Priority Data

Jun. 3, 1983 [EP] European Pat. Off. ............ 83105479

[51] Int. Cl.$^4$ .............................................. H03G 3/20
[52] U.S. Cl. .................................... 330/129; 330/135; 330/297
[58] Field of Search .............. 330/199, 297, 129, 135, 330/278, 279, 282, 284, 43

[56] References Cited

U.S. PATENT DOCUMENTS

| | | | |
|---|---|---|---|
| 2,689,887 | 9/1954 | Doehler | 330/43 |
| 2,752,430 | 6/1956 | Watkins | 330/43 |
| 4,066,965 | 1/1978 | Schultz et al. | 375/59 |
| 4,112,384 | 9/1978 | Buchberger | 330/135 |

FOREIGN PATENT DOCUMENTS

| | | |
|---|---|---|
| 1298201 | 6/1969 | Fed. Rep. of Germany . |
| 3036613 | 4/1982 | Fed. Rep. of Germany . |
| 74801 | 1/1956 | France . |
| 2401510 | 3/1979 | France . |
| 2482800 | 11/1981 | France . |

OTHER PUBLICATIONS

J. F. Heney et al., "High Efficiency, KA-Band, Traveling Wave Tube Amplifiers for Intersatellite Links", International Conference on Communications, Conf. Record No. 4, Session 70, Jun. 1981.
V. J. Thottuvelil et al., "Analysis and Design of a Push-Pull Current-Fed Converter", *Power Electronics Specialist Conference Record* 1981 (*IEEE*), (1981) pp. 192–203.
R. Redl et al., "Push-Pull Current-Fed Multiple-Output . . . Operation at Duty Ratio Below 50%", *Power Electronics Specialist Conference Record* 1981 (*IEEE*), (1981) pp. 204–212.
P. Sopper, "A High Voltage, High Power Pulsed TWT Power Supply for Space Application", *Power Electronics Specialist Conference Record* 1981 (*IEEE*), (1981) pp. 302–311.

Primary Examiner—James B. Mullins
Assistant Examiner—G. Wan
Attorney, Agent, or Firm—Spencer & Frank

[57] ABSTRACT

The present invention relates to a method for automatically regulating the HF output power of a high frequency amplifier wherein a regulating voltage is utilized to produce a control voltage or a control current for controlling the gain of the amplifier, a first voltage which depends on the HF output power is derived from the supply voltage and/or from the supply current of the current supply device providing the power required to generate the HF power; the regulating voltage is formed of two components, with the first component being generated from the first voltage and a first reference voltage, and with the second component being generated from a second voltage which depends on the control voltage or on the control current generated by the control voltage and from a second reference voltage; and that for high HF power essentially only the first regulating component is active and for low and medium power, whose range approximately covers the linear operating range of the amplifier, essentially only the second regulating component is active.

15 Claims, 6 Drawing Figures

AUTOMATIC REGULATION OF THE OUTPUT POWER OF AN AMPLIFIER

BACKGROUND OF THE INVENTION

The present invention relates to a method for the automatic regulation of the high frequency output power of a high frequency amplifier including a regulating circuit wherein a voltage which is dependent on the high frequency (HF) output power is obtained and used to generate a regulating voltage with the aid of a reference voltage, and this regulating voltage is used to produce a control voltage or a control current which controls the amplifier gain. The present invention also relates to a circuit arrangement for implementing the method according to the invention.

In power amplifiers for amplifying high frequency signals it is desirable to operate in a linear mode at small and medium HF power and to limit the output power at a higher HF output power, with the power level at which the limiting starts being variable according to characteristics OAE and OA′E′ shown in FIG. 1. By making available such limiting characteristics, there results the advantage that the current supply device need provide only the power corresponding to the limitation value AE of the HF output power. However, it is necessary for limitation characteristics AE and A′E′, to be employed only for mean power, and therefore, for short-time fluctuations of the input power in the lower frequency range of the communications signals or of the high frequency carrier, the natural characteristic OABC and OABD, respectively, of FIG. 1 continues to be applicable as before. This condition must be met by suitably dimensioning the regulating time constant of the corresponding regulating device.

Various circuit arrangements are known for producing the limitation characteristic, examples of which are shown in FIGS. 2 and 3. FIG. 2 shows the conventional ALC (automatic level control) circuit wherein part of the output power produced by high frequency amplifier 1 is coupled out and is rectified in coupler 2, is then compared in a comparator 3 with a reference signal REF, amplified, and finally fed to a controllable attenuation member 4. In this way, the amplitude of the input signal $P_1$ of high frequency amplifier 1 is influenced in such a manner that the control loop keeps output power $P_2$ at a constant level. If the input power $P_1$ is continuously reduced, attenuation member 4 of FIG. 2 will reach its minimum attenuation in the region of characteristic AA′ of FIG. 1, so that the control loop is interrupted and amplifier 1 operates according to its natural characteristic OA′A.

The circuit according to FIG. 3 operates in a similar manner. In contradistinction to FIG. 2, the output power of amplifier 1 is here regulated by way of a control electrode, independently of the input power $P_1$.

The known circuit arrangements for realizing the desired limitation characteristics have the drawback that additional components, primarily high frequency modules, are required for the regulating circuit. These are, for example in FIG. 2, the controllable attenuation member 4 and the coupler with integrated rectifier 2. Added to this are the HF transmission losses of the coupler 2.

SUMMARY OF THE INVENTION

It is therefore the object of the present invention to provide a method and a circuit arrangement for implementing the method in which no high frequency modules are required in the regulating circuit and the expenditures for the regulation can be reduced.

The above object is achieved according to the present invention in that in a method for automatically regulating the high frequency output power of a high frequency amplifier including a regulating circuit wherein a first voltage which is dependent on the high frequency output power of the amplifier is obtained and used to generate a regulating voltage which is then utilized to produce a control signal i.e., a voltage or current, for controlling the amplifier gain, the first voltage is derived from the supply voltage or the supply current of the current supply device for the amplifier which provides the power required for the amplifier to generate the high frequency power; a first regulating voltage component is generated from the first voltage and a first reference voltage; a second voltage which is dependent on the value of the control signal is derived; a second regulating voltage component is generated from the second voltage and a second reference signal; and essentially only the second regulating component is utilized as the regulating voltage to produce the control signal for the high frequency output power in the low and medium power range covering approximately the linear operating range of the amplifier; and essentially only the first regulating component is utilized as the regulating voltage to produce the control signal for the high frequency output power in the high power range.

The above object is likewise achieved by a circuit for automatically regulating the high frequency output power of a high frequency amplifier which comprises: a high frequency amplifier; a regulated first circuit means for supplying d.c. power to the amplifier; a second circuit means, which is responsive to a regulating voltage, for supplying a control signal to the amplifier to control the amplifier gain; a first measuring means, connected to the first circuit means, for providing an output voltage which is a measure of the power supplied to the amplifier by the first circuit means; a first comparator means for comparing the output voltage of the first measuring means with a first reference voltage to provide a first difference signal; a second measuring means for providing an output voltage which is a measure of the control signal; a second comparator for comparing the output voltage of the second measuring means with a second reference voltage to produce a second difference signal; and third circuit means, connected to the outputs of the first and second comparators, for applying the first difference signal to the second circuit means as the regulating voltage when the output signal from the first measuring means represents a high supply power corresponding to a high high frequency output power of the amplifier, and for applying the second difference signal to the second circuit means as the regulating signal when the output signal from the first measuring means represents, a low or medium supply power corresponding to a low or medium high frequency output power covering approximately to the linear operating range of the amplifier.

The method according to the present invention and the circuit arrangement for implementing the method have the advantage that the use of expensive high frequency modules is avoided in the regulating circuit and that the regulating expenditures are relatively low.

The present invention is based on the realization that the HF output power depends on the direct current power supplied by the current supply device, with this dependence being essentially of a proportional nature, and on the idea of regulating the HF output power by utilizing a criterion derived from the direct current power provided.

DETAILED DESCRIPTION OF THE PREFERRED EMBODIMENTS

Figure 1:
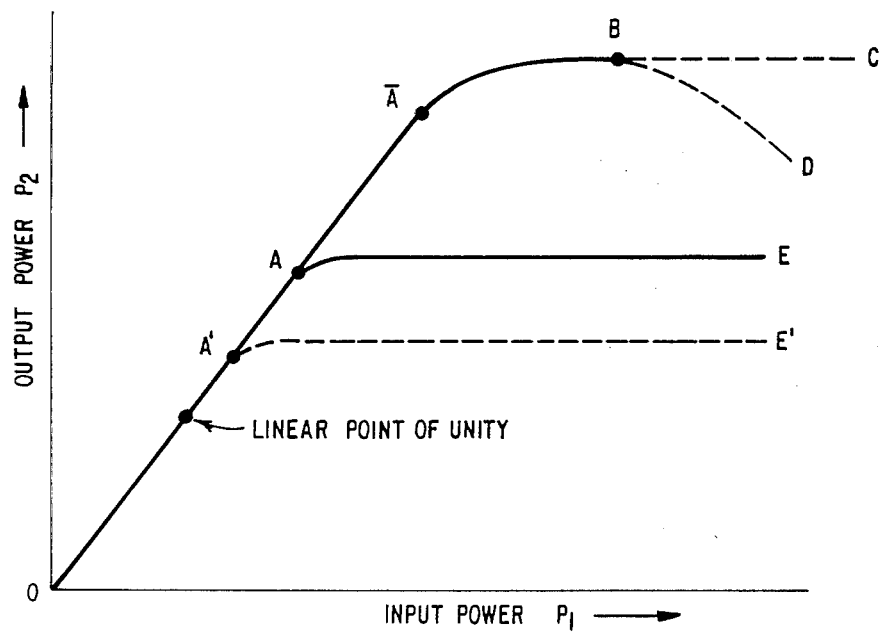
FIG. 1 shows the transmission characteristic of an HF power amplifier having the above-described operating characteristics.
Figure 2:
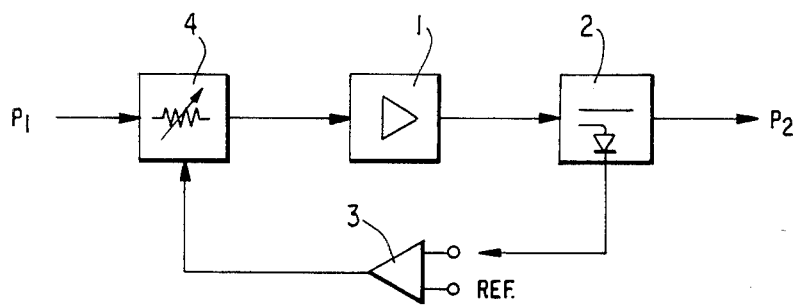
FIGS. 2 and 3 show circuit arrangements for realizing the regulating characteristics according to the prior art which have also been described above.
Figure 3:
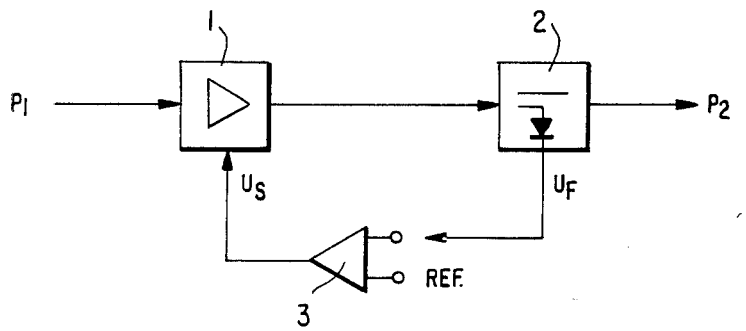
Figure 4:
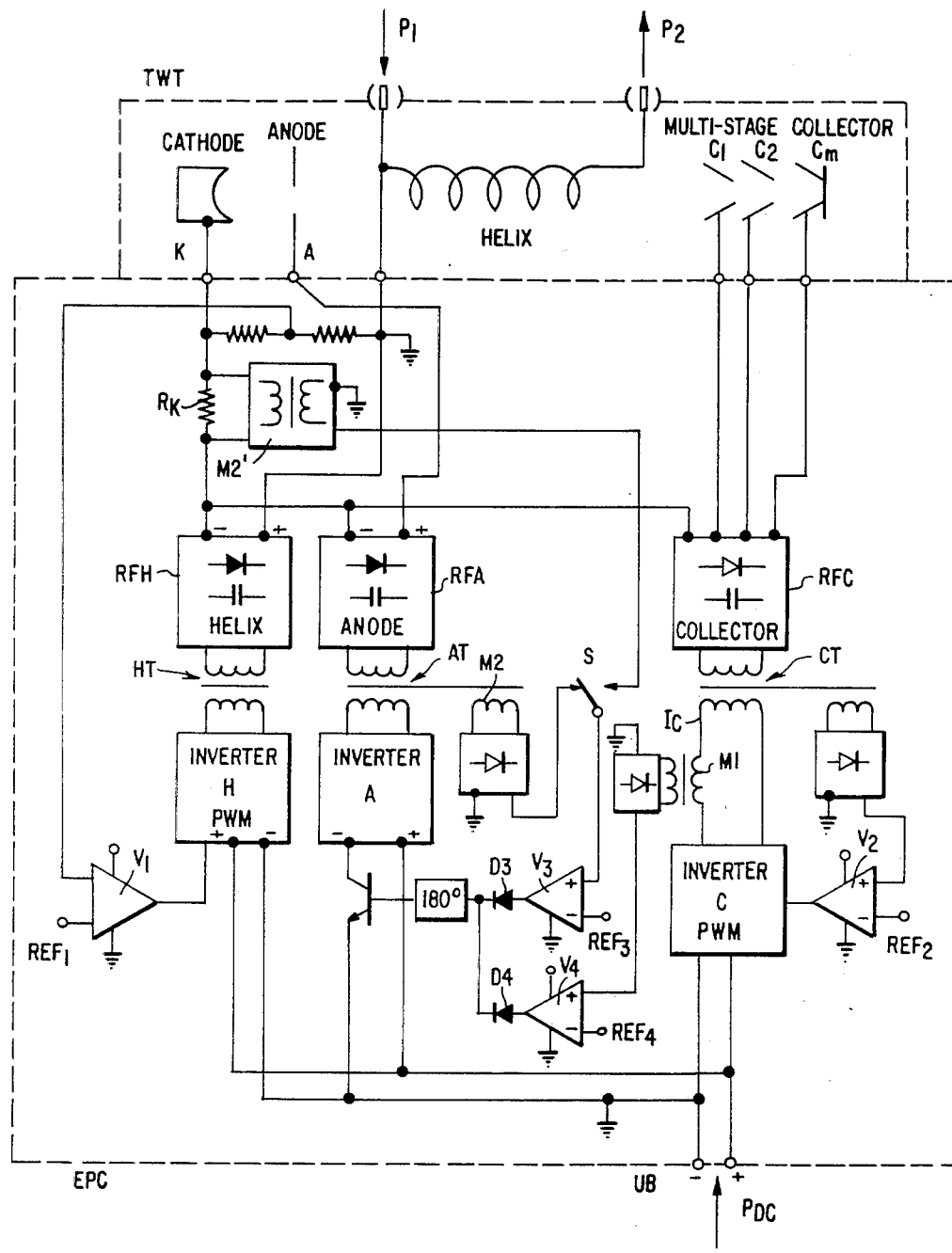
FIG. 4 is a block circuit diagram for a travelling wave tube amplifier (TWTA) equipped with current supply devices and central circuits according to the invention.

The upper portion of FIG. 4 shows a symbolically represented traveling wave tube TWT including a cathode K, an anode A, a helix and collectors $C_l$ to $C_m$, with, as usual, $m \leq 5$. The circuit arrangement EPC disposed therebelow serves the purpose of supplying the above-mentioned electrodes with the necessary operating voltages, which generally reach several 1000 volts. In a known manner, the current supply device comprises switching network members, and the direct current power $P_{DC}$, with a relatively low operating voltage of $U_B \approx 50$ V, supplied at the input of the current supply device is converted to an alternating voltage in inverters A, H and C, is then transformed to a higher voltage in subsequently connected transformers AT, HT and CT respectively and is then, after rectification and filtering in respective circuits RFA, RFH and RFC, made available for the load electrodes A, K, helix and C-Cm. The voltage supply device further includes three regulating devices including comparators $V_1$, $V_2$ and $V_3$ for keeping the operating voltages constant. In the comparator $V_1$, the voltage across the helix and the cathode K is compared with a reference voltage $REF_1$ and, if an error signal appears at the output of comparator $V_1$, the turn-on time of the chopping transformers of inverter H is changed in such a manner that the transformed and rectified output voltage sets itself to the desired value.

Comparators $V_2$ and $V_3$ operate in a corresponding manner and act on the collector and anode operating voltages, respectively. Comparator $V_2$ compares the output voltage of inverter C, as detected by a measuring winding on the transformer CT, with a reference voltage $REF_2$, while comparator $V_3$ compares its input signal with a reference voltage $REF_3$. With the aid of a switch S, it is possible to use the comparator $V_3$ to regulate either the anode voltage or the cathode current of the traveling wave tube to a constant amplitude. The actual voltage value supplied to the comparator $V_3$ is obtained in the former case by way of a measuring winding M2 on the anode transformer AT, and in the latter case, by way of a measuring transformer M2' whose primary winding is connected across a measuring resistor $R_K$ which is serially connected between the cathode K and its current supply terminal of circuit RFH. The regulating arrangement including comparator $V_3$ operates as a so-called series regulator in that its output controls an element in series with the input of the inverter A as represented by the transistor T. As shown in FIG. 4, the output voltage of comparator $V_3$ is connected to the control electrode or base of regulating transistor T via a decoupling diode $D_3$ (whose function will be explained below) and a 180° phase shifter. Due to the applied 180° phase shift, the regulating direction of the setting member for the anode voltage converter is such that an increase in the output voltage of comparator $V_3$ results in a decrease in the alternating voltage at the output of inverter A.

Examples of the power supply circuits of FIG. 4 are described, for example in articles by V. J. Thottuvelil et al, R. Redl et al, and P. Sopper beginning at pages 192, 204 and 302, respectively in the POWER ELECTRONICS SPECIALIST CONFERENCE RECORD 1981 (IEEE).

According to the present invention, the primary winding M1 of a measuring transformer M1 is connected between the output of inverter C and the associated transformer CT. This measuring transformer feeds a sensing voltage that is proportional to the collector current $I_C$, and thus to the collector power, to an additional comparator $V_4$ where it is compared with a reference voltage $REF_4$. The output of comparator $V_4$ is connected via a decoupling diode $D_4$ to the input of the 180° phase shifter. The error signal at the output of the comparator $V_4$ controls the setting member T for the anode inverter A in such a manner that the consumed collector power of the travelling wave tube is kept constant if a certain value of the collector current $I_C$, and thus of the output power, is exceeded.

Figure 5A:
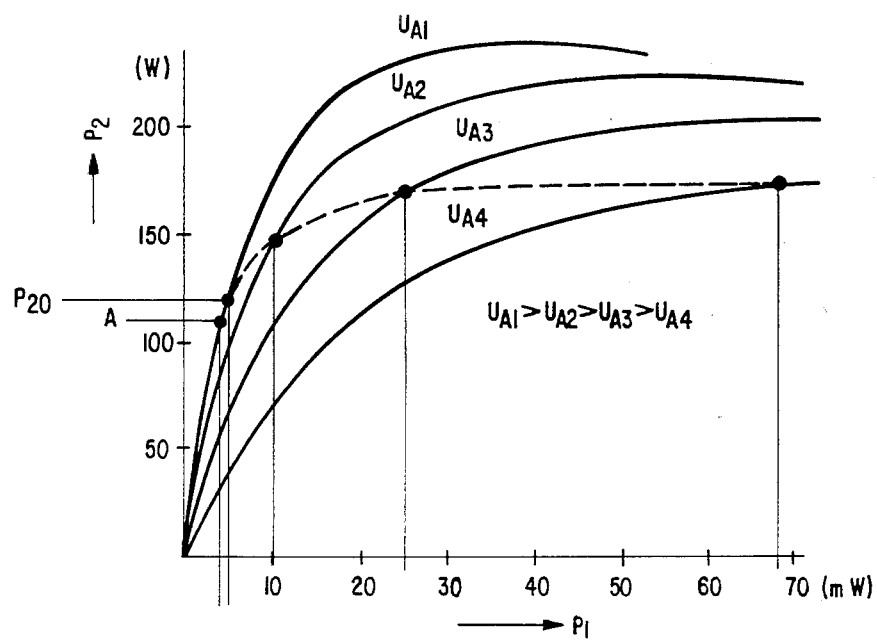
FIGS. 5a and 5b show the characteristics for the HF output power $P_2$ and for the direct current collector power consumption $P_C$ as they can be realized with the circuit arrangement according to FIG. 4, plotted in each case over the HF input power $P_1$.

The operation will be explained in greater detail below with the aid of FIGS. 5a and 5b. FIG. 5a shows the transmission curves of a traveling wave tube having the anode voltage $U_A$ as a variable parameter. It is assumed that all supply voltages are in a regulated state, with operating point A resulting at a control or input power $P_1$. The curves shown in FIG. 5b indicate the consumed collector power $P_C$ in dependence on the control or input power $P_1$. With the above-stated operating point A, there result the collector power $P_C$ marked B which is assumed to be less than the value $P_{CO}$, which corresponds to the reference voltage $REF_4$ of FIG. 4, i.e. the output voltage of comparator $V_4$ is less than that of comparator $V_3$. The latter determines the regulating voltage of inverter A, and the anode voltage has the predetermined value $U_{A1}$.

Figure 5B:
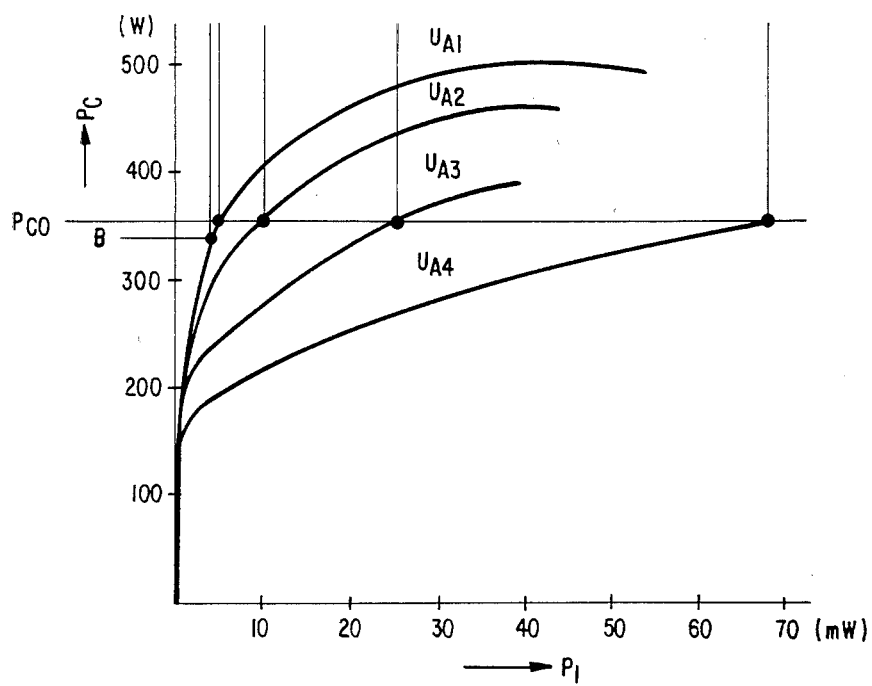

If the HF input power $P_1$ is increased gradually, the consumed collector power increases as shown in FIG. 5b. This also increases the average current $I_C$ in the transformer CT following inverter C. If now the sensor voltage obtained via MI from collector current $I_C$ exceeds the value $REF_4$, which corresponds to the power $P_{CO}$ of FIG. 5b, the output voltage of comparator $V_4$ increases to beyond the value of the output voltage of comparator $V_3$, so that the latter is decoupled from the control loop by the blocking diode $D_3$ at its output. Now comparator $V_4$ determines the curve of the anode voltage, with the regulating device operating in such a manner that, with increasing output power $P_1$, the anode voltage decreases with the aim to limit the collector power to the value $P_{CO}$.

The further course of the transmission characteristic is shown as a dashed curve in FIG. 5a, as it can be constructed from the points of intersection of the collector power limitation characteristics $P_{CO}$ with the curves of the input power characteristic shown in FIG. 5b which is plotted in dependence on the anode voltage ($U_{A1}$, $U_{A2}$, $U_{A3}$ and $U_{A4}$). The dashed curve in FIG. 5a exhibits a distinct limitation behavior whose starting point $P_{20}$ can be set by suitable selection of the reference voltage REF4. Since the consumed collector power $P_C$ is generally more than 90% of the total power consumed by a traveling wave tube, this also results in a very clearly discernible limitation of the total power consumption.

Although the invention has been described with regard to a travelling wave type of high frequency amplifier, the invention is also applicable to other types of high frequency amplifiers. For example, the high frequency amplifier could be equipped with bipolar or field effect transistors in which case the detected supply current is the collector or drain current, respectively, and the control current is the base or gate current, respectively.

It will be understood that the above description of the present invention is susceptible to various modifications, changes and adaptations, and the same are intended to be comprehended within the meaning and range of equivalents of the appended claims.

What is claimed is:

1. In a method for automatically regulating the high frequency output power of a high frequency amplifier having a current supply device which provides the power required for the amplifier to generate said high frequency power, and including a regulating circuit wherein a first voltage which is related to the high frequency output power of the amplifier is obtained and used to generate a regulating voltage which is then utilized to produce a control signal for controlling the amplifier gain, the improvement comprising:
deriving said first voltage from the supply voltage or the supply current of the current supply device for the amplifier;
generating a first regulating voltage component from said first voltage and a first reference voltage;
deriving a second voltage which is dependent on the value of said control signal;
generating a second regulating voltage component from said second voltage and a second reference signal; and
utilizing essentially only said second regulating component as said regulating voltage to produce said control signal for said high frequency output power in the low and medium power range covering approximately the linear operating range of the amplifier; and
utilizing essentially only said first regulating component as said regulating voltage to produce said control signal for high frequency output power in the high power range.

2. A method as defined in claim 1 wherein: said step of generating a first regulating voltage component includes comparing said first voltage with said first reference voltage to produce a difference voltage corresponding to said first component; and said step of generating a second regulating voltage component includes comparing said second voltage with said second reference voltage to produce a difference voltage corresponding to said second component.

3. A method as defined in claim 1 wherein said control signal is a control voltage.

4. A method as defined in claim 1 wherein said second voltage is dependent on a control voltage.

5. A method as defined in claim 4 wherein said second voltage is dependent on a control current generated by said control voltage.

6. A circuit for automatically regulating the high frequency output power of a high frequency amplifier comprising in combination:
a high frequency amplifier; a regulated first circuit means for supplying the d.c. power to said amplifier; a second circuit means, which is responsive to a regulating voltage, for supplying a control signal to said amplifier to control the amplifier gain; a first measuring means, connected to said first circuit means, for providing an output voltage which is a measure of the power supplied to said amplifier by said first circuit means; a first comparator means for comparing said output voltage of said first measuring means with a first reference voltage to provide a first difference signal; a second measuring means for providing an output voltage which is a measure of said control signal; a second comparator for comparing said output voltage of said second measuring means with a second reference voltage to produce a second difference signal; and third circuit means, connected to the outputs of said first and second comparators, for applying said first difference signal to said second circuit means as said regulating voltage when said output signal from said first measuring means represents a high power input corresponding to a high high frequency output power of said amplifier, and for applying said second difference signal to said second circuit means as said regulating signal when said output signal from said first measuring means represents a low or medium high frequency output power in a range covering approximately the linear operating range of said amplifier.

7. A circuit arrangement as defined in claim 6 wherein said first measuring means detects the supply current provided by said first circuit means.

8. A circuit arrangement as defined in claim 7 wherein said second measuring means detects the control voltage provided by said second circuit means.

9. A circuit arrangement as defined in claim 7 wherein said second measuring means detects the control current provided by said second circuit means.

10. A circuit arrangement as defined in claim 6 wherein said third circuit means includes respective diodes connected in series with the outputs of said first and second comparators and a common connection point at which said regulating voltage appears.

11. A circuit arrangement as defined in claim 6 wherein said first and second measuring means are respective measuring transformers with respective subsequently connected rectifiers.

12. A circuit arrangement as defined in claim 6 wherein: said amplifier is a travelling wave tube amplifier including an anode, a cathode and a multistage collector arrangement; said control voltage is the anode voltage for said travelling wave tube; said first circuit means supplies the power to said collectors; and said first measuring means detects the supply current provided by said first circuit means to at least one of said collectors of said multi-stage collector arrangement.

13. A circuit arrangement as defined in claim 12 wherein: said first circuit means includes a direct current inverter with a subsequently connected transformer and subsequently connected rectifier and filtering device; and wherein said first measuring means includes a measuring transformer having its primary winding connected in series between said direct current inverter and the primary winding of said subsequently connected transformer so that the average current in said primary winding of said subsequently connected transformer is detected.

14. A circuit arrangement as defined in claim 6, wherein: said amplifier is a transistor amplifier with bipolar transistors; said first measuring means detects the the collector current for said transistors; and said control signal is the base current, of said transistors.

15. A circuit arrangement as defined in claim 6 wherein: said amplifier is a transistor amplifier with field effect transistors; said first measuring means detects the drain current of said transistors; and said control signal is the gate current of said transistors.

* * * * *